(12) United States Patent
Kang

(10) Patent No.: US 7,682,928 B2
(45) Date of Patent: Mar. 23, 2010

(54) METHOD OF FORMING ISOLATION LAYER OF SEMICONDUCTOR DEVICE

(75) Inventor: Myung Il Kang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 499 days.

(21) Appl. No.: 11/642,546

(22) Filed: Dec. 21, 2006

(65) Prior Publication Data

US 2007/0148907 A1    Jun. 28, 2007

(30) Foreign Application Priority Data

Dec. 28, 2005    (KR) ...................... 10-2005-0131498

(51) Int. Cl.
   *H01L 21/00*    (2006.01)
(52) U.S. Cl. ..................... 438/424; 438/425; 438/427
(58) Field of Classification Search ......... 438/424–425, 438/427
   See application file for complete search history.

(56) References Cited

U.S. PATENT DOCUMENTS

| | | | | |
|---|---|---|---|---|
| 5,646,063 A * | 7/1997 | Mehta et al. | ................. | 438/425 |
| 5,702,977 A * | 12/1997 | Jang et al. | ...................... | 216/38 |
| 5,728,621 A * | 3/1998 | Zheng et al. | ................. | 438/427 |
| 5,817,568 A * | 10/1998 | Chao | ........................... | 438/427 |
| 5,880,007 A * | 3/1999 | Varian et al. | ................. | 438/427 |
| 5,928,959 A * | 7/1999 | Huckels et al. | .............. | 438/691 |
| 6,048,775 A * | 4/2000 | Yao et al. | ..................... | 438/427 |
| 6,051,496 A * | 4/2000 | Jang | ............................ | 438/687 |
| 6,180,489 B1 * | 1/2001 | Yang et al. | ................... | 438/424 |
| 6,261,923 B1 * | 7/2001 | Kuo et al. | .................... | 438/427 |
| 6,265,302 B1 * | 7/2001 | Lim et al. | .................... | 438/622 |
| 6,297,126 B1 * | 10/2001 | Lim et al. | .................... | 438/424 |
| 6,350,661 B2 * | 2/2002 | Lim et al. | .................... | 438/424 |
| 6,365,523 B1 * | 4/2002 | Jang et al. | ................... | 438/692 |
| 2001/0031540 A1 * | 10/2001 | Lim et al. | .................... | 438/424 |
| 2007/0148907 A1 * | 6/2007 | Kang | ........................ | 438/427 |

* cited by examiner

*Primary Examiner*—Laura M Menz
(74) *Attorney, Agent, or Firm*—Lowe Hauptman Ham & Berner, LLP

(57) ABSTRACT

There is provided a method of forming an isolation layer which prevents a failure from occurring depending on a difference in the area of the isolation layer during a planarization process of the isolation layer having a shallow trench isolation (STI) structure. The present invention implements a uniform isolation layer by forming a chemical mechanical polishing (CMP) stop layer on an isolation layer having a relatively large region and performing a planarization process using the CMP stop layer. In accordance with an embodiment of the present invention, an isolation layer is completed by: forming a buffer insulating layer on a silicon substrate and patterning the buffer insulating layer; selectively etching the silicon substrate and forming trenches including a relatively big region and a relatively narrow region; depositing a first insulating layer and a second insulating layer sequentially on a whole surface of the silicon substrate; selectively removing the second insulating layer and forming a chemical mechanical polishing (CMP) stop layer only on the relatively large trench region; planarizing the first insulating layer using the CMP stop layer; and removing all of the CMP stop layer and the buffer insulating layer and completing an isolation layer.

9 Claims, 2 Drawing Sheets

METHOD OF FORMING ISOLATION LAYER OF SEMICONDUCTOR DEVICE

FIELD OF THE INVENTION

The present invention relates to a technique for forming an isolation layer on a semiconductor device, and more particularly, to a method of forming an isolation layer which prevents a failure from occurring depending on a difference in the area of the isolation layer during a planarization process of the isolation layer in a shallow trench isolation (STI) structure.

BACKGROUND OF THE INVENTION

Shallow trench isolation (STI) is widely used as an isolation technique in semiconductor devices. The STI technique is such as to form a trench in a silicon substrate, filling the trench with an oxide layer and planarizing the oxide layer, to form an isolation layer. Since a trench isolation layer exhibits good isolation characteristic and is narrow in occupancy area, it can properly meet the tendency that the integration density of a semiconductor device is increasing.

However, in the trench isolation layer, a dishing failure occurs depending on a difference in the area of the isolation layer during planarization. FIG. 1 is a sectional view illustrating an example of such a failure.

As illustrated in FIG. 1, after a trench 11 is formed in a field region of a silicon substrate 10, an oxide layer 12 is deposited so as to fill the trench 11. A chemical mechanical polishing (CMP) process is performed to planarize the oxide layer 12. The extent of the planarization of the oxide layer 12 varies depending on the difference in the area of the isolation layer, that is, depending on whether the area of the trench 11 is wide or narrow. In other words, the so-called dishing failure, i.e., the phenomenon wherein a middle portion of the oxide layer 12 is depressed, occurs in the trench 11 having a relatively big area. This dishing failure can causes a defect in a semiconductor device during a subsequent process.

To prevent the failure during the planarization process and to maintain a uniform thickness and profile of an isolation layer irrespective of the area of the isolation layer, a related art has used a technique of forming a dummy active region on the field region. However, the dummy active region may cause noise in a mixed signal integrated circuit which uses both analog and digital signals on a same chip.

SUMMARY OF THE INVENTION

The present invention is therefore directed to providing a method of forming an isolation layer which prevents the above type of failure from occurring depending on a difference in the area of the isolation layer during planarization processes.

The present invention is also directed to providing a method of forming an isolation layer which maintains a uniform thickness and profile of the isolation layer without using a dummy active region.

To achieve the above, the present invention provides a method of forming an isolation layer which faciliates the formation of a uniform isolation layer by forming a chemical mechanical polishing (CMP) stop layer on an isolation layer over a relatively large region and performing a planarization process using the CMP stop layer.

In accordance with one embodiment of the present invention, there is provided a method of forming an isolation layer of a semiconductor device, comprising: forming a buffer insulating layer on a silicon substrate and patterning the buffer insulating layer; selectively etching the silicon substrate and forming trenches including a relatively wide/large region and a relatively small/narrow region; depositing a first insulating layer and a second insulating layer sequentially on a whole surface of the silicon substrate; selectively removing the second insulating layer and forming a chemical mechanical polishing (CMP) stop layer only on the relatively wide/large trench region; planarizing the first insulating layer using the CMP stop layer; and removing all of the CMP stop layer and the buffer insulating layer and completing an isolation layer.

In the method of forming an isolation layer in accordance with the above embodiment of the present invention, the first insulating layer may be an oxide layer formed using high density plasma chemical vapor deposition (HDP-CVD), and the second insulating layer and the CMP stop layer formed therefrom may be one or more silicone nitride layers. The second insulating layer may be deposited so as to have a thickness of several hundreds Å, using a low pressure chemical vapor deposition process or a plasma enhanced chemical vapor deposition process. The CMP stop layer may have the width proportional to the area of the trench and may be removed using a phosphoric acid.

In the method of forming an isolation layer in accordance with the embodiment of the present invention, the method may further comprise forming a liner oxide layer on the surface of the trenches before depositing the first insulating layer on the whole surface of the silicon substrate. The trenches may be formed using a dry etching process. The trenches may be formed to be several thousands Å in depth.

BRIEF DESCRIPTION OF THE DRAWINGS

The above and other objects and features of the present invention will become apparent from the following description of preferred embodiments given in conjunction with the accompanying drawings, in which:

FIGS. 2A through 2C are sectional views illustrating a method of forming an isolation layer in accordance with an embodiment of the present invention, wherein FIG. 2A is a sectional view illustrating deposition of first and second insulating layers, FIG. 2B is a sectional view of selective etching of the second insulating layer, and FIG. 2C is a sectional view of a completed isolation layer.

DETAILED DESCRIPTION OF THE EXEMPLARY EMBODIMENTS

Hereinafter, exemplary embodiments of the present invention will be described in detail with reference to the accompanying drawings so that they can be readily implemented by those skilled in the art. Where the function and constitution are well-known in the relevant arts, a detailed description will not be given in the detailed description for the sake of brevity and clarity.

Figure 1:
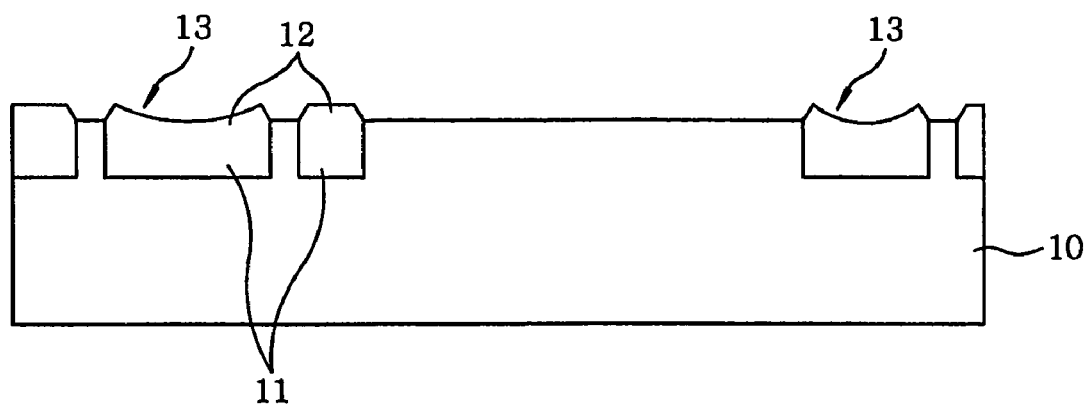
FIG. 1 is a sectional view illustrating an example of a failure occurring in a conventional method of forming an isolation layer.
Figure 2A:
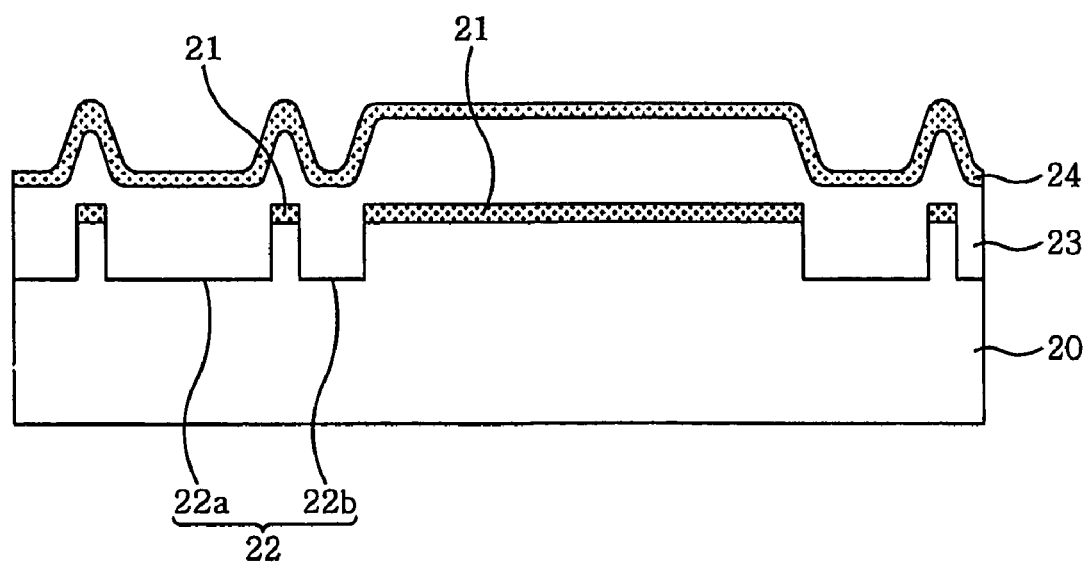
Figure 2B:
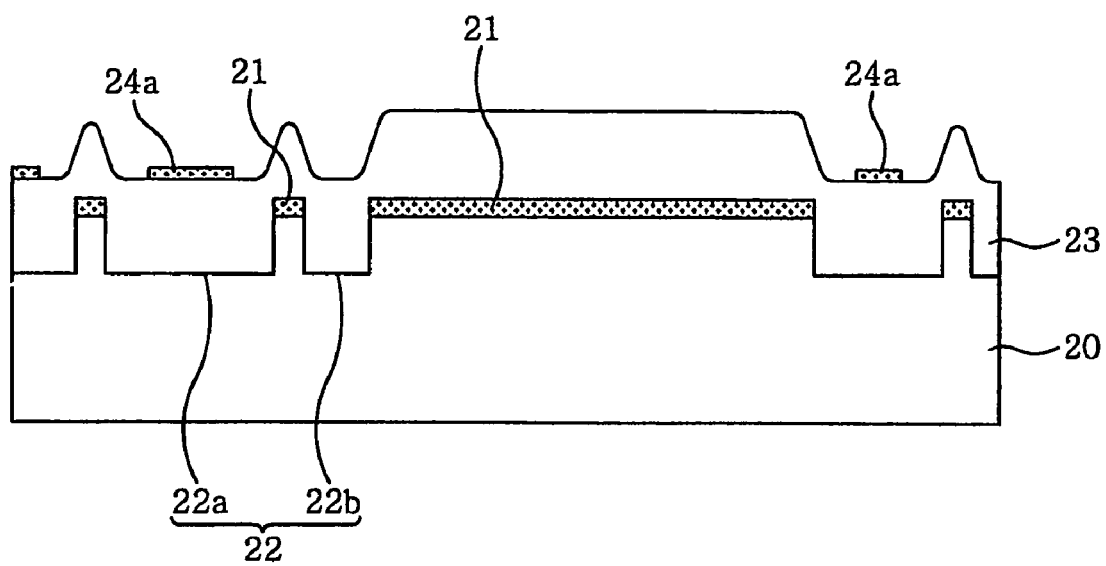
Figure 2C:
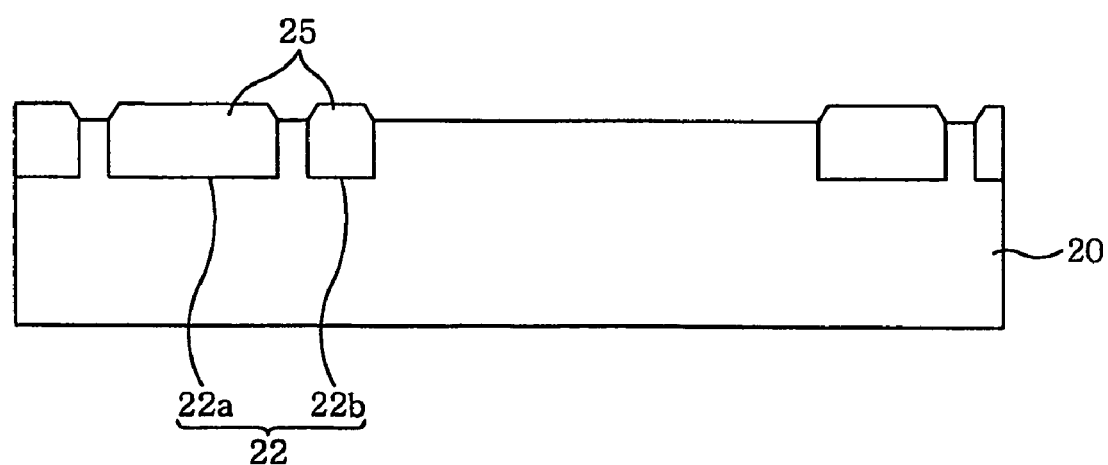

FIGS. 2A through 2C are sectional views illustrating a method of forming an isolation layer in accordance with an embodiment of the present invention. FIG. 2A is a sectional view illustrating the deposition of a first insulating layer and a second insulating layer, FIG. 2B is a sectional view showing the result of selective etching of the second insulating layer, and FIG. 2C is a sectional view illustrating a completed isolation layer.

As illustrated in FIG. 2A, after a buffer insulating layer 21 is formed on a silicon substrate 20 and is patterned The silicon substrate 20 is selectively etched to form trenches 22. The buffer insulating layer 21 includes, for example, a pad oxide layer and a pad nitride layer. The trenches 22 where an isolation layer is to be formed are formed to be several thousand Å in depth, using a dry etching process such as the reactive ion etching (RIE). Generally, the trenches 22 include a relatively wide trench region 22a and a relatively narrow trench region 22b.

After the trenches 22 are formed, a first insulating layer 23 and a second insulating layer 24 are sequentially formed over the entire surface of the silicon substrate 20. For example, the first insulating layer 23 is an oxide layer used to fill the trench using high density plasma chemical vapor deposition (HDP-CVD). The first insulating layer 23 is deposited so as to be thicker than the depth of the trenches 22. The second insulating layer 24 is, for example, a silicon nitride layer, and it is deposited so as to have a thickness of several hundred Å, using a low pressure chemical vapor deposition (LP-CVD) process or a plasma enhanced chemical vapor deposition (PE-CVD) process. Before the trenches 22 are filled with the first insulating layer 23, a liner oxide layer (not shown) may be formed on the surface of the trenches 22, using a thermal oxidation process.

Subsequently, the second insulating layer 24 is selectively removed by a typical photolithography process, to form a chemical mechanical polishing (CMP) stop layer 24a as shown in FIG. 2B. The CMP stop layer 24a is determined, considering the relative areas of the trenches 22. That is, the CMP stop layer 24a is formed on the relatively wide trench region 22a but not formed on the relatively narrow trench region 22b. Also, the width of the CMP stop layer 24a itself may be determined in proportion to the area of the wide trench region 22a.

Subsequently, the first insulating layer 23 is planarized using a chemical mechanical polishing (CMP) process, to complete an isolation layer 25 shown in FIG. 2C. Due to the CMP stop layer 24a formed on the wide trench region 22a, a dishing failure occurring in a conventional method does not occur during the planarization process. The CMP stop layer 24a and the buffer insulating layer 21 (of FIG. 2B) remaining after the planarization process are all removed, using a suitable chemical solution. For example, a silicon nitride layer can be removed, using a phosphoric acid.

As described above, the method of forming an isolation layer in accordance with the embodiment of the present invention facilitates the formation of a uniform isolation layer by forming the CMP stop layer on the isolation layer in the relatively wide trench region and performing the planarization process using the CMP stop layer. Furthermore, the method in accordance with this embodiment of the present invention prevents the dishing failure occurring depending on the difference in the area of the isolation layer, without forming the dummy active region used in a conventional method.

The terms used herein have the same meaning as commonly understood by one of ordinary skill in the art to which this invention pertains, for the purpose of easily describing the technical contents and assisting the skilled person in understanding the invention. The terms are not intended to be limiting of the embodiment of the invention.

While the invention has been shown and described with respect to a limited number of embodiments, it will be understood by those skilled in the art that various changes and modifications may be made without departing from the spirit and scope of the invention as defined in the following claims.

What is claimed is:

1. A method of forming an isolation layer of a semiconductor device, comprising:
    forming a buffer insulating layer on a silicon substrate and patterning the buffer insulating layer;
    selectively etching the silicon substrate and forming trenches having a relatively large region and a relatively narrow region;
    depositing a first insulating layer and a second insulating layer sequentially over the silicon substrate; selectively removing the second insulating layer by a photolithography process and forming a chemical mechanical polishing (CMP) stop layer only above the relatively large trench region;
    planarizing the first insulating layer by a chemical mechanical polishing (CMP) process using the CMP stop layer; and removing all of the CMP stop layer and the buffer insulating layer and completing the isolation layer,
    wherein the first insulating layer is an oxide layer by a high density plasma chemical vapor deposition (HDP-CVD).

2. The method of claim 1, wherein the second insulating layer and the CMP stop layer are silicon nitride layers.

3. The method of claim 1, wherein the depositing of the second insulating layer uses a low pressure chemical vapor deposition process or a plasma enhanced chemical vapor deposition process.

4. The method of claim 1, wherein the second insulating layer is coated in a thickness of several hundreds Å.

5. The method of claim 1, wherein a width of the CMP stop layer is in proportion to the region of the trench.

6. The method of claim 1, wherein the removing of the CMP stop layer is performed, using a phosphoric acid.

7. The method of claim 1, wherein the method further comprises forming a liner oxide layer on the surface of the trenches before depositing the first insulating layer on the whole surface of the silicon substrate.

8. The method of claim 1, wherein the trenches are formed using a dry etching process.

9. The method of claim 1, the trenches are formed to be several thousands Å in depth.

* * * * *